US008900695B2

(12) United States Patent
Kobrin et al.

(10) Patent No.: US 8,900,695 B2
(45) Date of Patent: Dec. 2, 2014

(54) DURABLE CONFORMAL WEAR-RESISTANT CARBON-DOPED METAL OXIDE-COMPRISING COATING

(75) Inventors: Boris Kobrin, Walnut Creek, CA (US); Romuald Nowak, Cupertino, CA (US); Jeffrey D. Chinn, Foster City, CA (US)

(73) Assignee: Applied Microstructures, Inc., San Jose, CA (US)

( * ) Notice: Subject to any disclaimer, the term of this patent is extended or adjusted under 35 U.S.C. 154(b) by 107 days.

(21) Appl. No.: 12/072,086

(22) Filed: Feb. 22, 2008

(65) Prior Publication Data

US 2008/0206539 A1    Aug. 28, 2008

Related U.S. Application Data

(60) Provisional application No. 60/903,151, filed on Feb. 23, 2007.

(51) Int. Cl.
| | |
|---|---|
| *H01L 21/316* | (2006.01) |
| *C23C 16/40* | (2006.01) |
| *C23C 16/455* | (2006.01) |
| *B81B 3/00* | (2006.01) |

(52) U.S. Cl.
CPC ......... *B81B 3/0075* (2013.01); *C23C 16/45525* (2013.01); *C23C 16/405* (2013.01); *C23C 16/403* (2013.01)
USPC ................. 428/220; 427/255.31; 106/287.17; 106/287.18; 106/287.19

(58) Field of Classification Search
USPC ................. 428/220; 427/255.31; 106/287.17, 106/287.18, 287.19
See application file for complete search history.

(56) References Cited

U.S. PATENT DOCUMENTS

| | | | |
|---|---|---|---|
| 3,924,032 A | 12/1975 | Hertl | |
| 4,780,334 A | 10/1988 | Ackerman | |
| 4,940,854 A | 7/1990 | Debe | |
| 4,992,306 A | 2/1991 | Hochberg et al. | |
| 5,314,724 A | 5/1994 | Tsukune et al. | |
| 5,331,454 A | 7/1994 | Hornbeck | 359/224 |

(Continued)

FOREIGN PATENT DOCUMENTS

WO    WO 2005056865 A1 *  6/2005

OTHER PUBLICATIONS

Ashurst, W.R. Nanometer-Thin Titania Films with SAM-Level Stiction and Superior Wear Resistance for Reliable MEMS Performance, 2004 (no month), IEEE, pp. 153-156.* Ashurst, W.R., et al. "Tribological impact of SiC encapsulation of released polycrystalline silicon microstructures," Tribology Letters, vol. 17, No. 2, pp. 195-198, Aug. 2004.

(Continued)

*Primary Examiner* — Aaron Austin
*Assistant Examiner* — Tahseen N Khan
(74) *Attorney, Agent, or Firm* — Martine Penilla Group, LLP

(57) ABSTRACT

The present invention is related to carbon-doped metal oxide films. The carbon-doped metal oxide films provide a low coefficient of friction, for example ranging from about 0.05 to about 0.4. In addition, the carbon-doped metal oxide films applied over a silicon substrate, for example, provide antistiction properties, where the measured work of adhesion for a MEMS device cantilever beam coated with the carbon-doped metal oxide film is less than 10 µJ/m². In addition, the carbon-doped metal oxide films provide unexpectedly good water vapor transmission properties. The carbon content in the carbon-doped metal oxide films ranges from about 5 atomic % to about 20 atomic %.

16 Claims, 5 Drawing Sheets

(56) References Cited

U.S. PATENT DOCUMENTS

| | | | |
|---|---|---|---|
| 5,352,485 | A | 10/1994 | DeGuire et al. |
| 5,480,488 | A | 1/1996 | Bittner et al. |
| 5,527,744 | A | 6/1996 | Mignardi et al. |
| 5,804,259 | A | 9/1998 | Robles |
| 5,879,459 | A | 3/1999 | Gadgil et al. |
| 5,966,499 | A | 10/1999 | Hinkle et al. |
| 5,989,345 | A | 11/1999 | Hatano |
| 6,068,884 | A | 5/2000 | Rose et al. |
| 6,165,566 | A | 12/2000 | Tropsha |
| 6,225,237 | B1 | 5/2001 | Vaartstra |
| 6,358,863 | B1 | 3/2002 | Desu et al. |
| 6,503,330 | B1 | 1/2003 | Sneh et al. |
| 6,743,516 | B2 | 6/2004 | Murphy et al. |
| 6,743,736 | B2 | 6/2004 | Mardian et al. |
| 6,905,549 | B2 | 6/2005 | Okuda et al. |
| 7,009,745 | B2 | 3/2006 | Miller et al. ............... 359/212 |
| 7,208,195 | B2 | 4/2007 | Kalynushkin et al. |
| 7,524,791 | B2* | 4/2009 | Furuya ...................... 502/180 |
| 2001/0025690 | A1* | 10/2001 | DeLouise et al. ............ 156/334 |
| 2002/0164420 | A1 | 11/2002 | Derderian et al. |
| 2003/0124868 | A1* | 7/2003 | Mizukoshi ................... 438/710 |
| 2003/0180458 | A1 | 9/2003 | Sneh |
| 2004/0182316 | A1 | 9/2004 | Watanabe |
| 2004/0261703 | A1 | 12/2004 | Kobrin et al. |
| 2005/0012975 | A1* | 1/2005 | George et al. ............... 359/223 |
| 2005/0037193 | A1 | 2/2005 | Sun et al. ................... 428/332 |
| 2005/0079708 | A1 | 4/2005 | Yamasaki et al. |
| 2005/0081787 | A1 | 4/2005 | Im et al. |
| 2005/0109277 | A1 | 5/2005 | Kobrin et al. |
| 2005/0118428 | A1 | 6/2005 | Bicker et al. |
| 2005/0147918 | A1* | 7/2005 | Weber et al. ............ 430/270.1 |
| 2006/0160376 | A1* | 7/2006 | Padhi et al. ................ 438/789 |

OTHER PUBLICATIONS

Carcia, P.F., et al. "Ca test of Al2O3 gas diffusion barriers grown by atomic layer deposition on polymers," Applied Physics Letters, 89, 031915, pp. 1-3, 2006, Jul. 23, 2006.

Carraro, C., et al. "Exceptional Wear Resistance of MEMS Devices Coated With Carbon-Doped Alumina Films," Department of Chemical Engineering and Berkeley Sensor and Actuator Center, University of California, Berkeley, CA 94720.

Herrman, Cari F., et al. "Conformal Hydrophobic Coatings Prepared Using Atomic Layer Deposition Seed Layers and Non-Chlorinated Hydrophobic Precursors," J Micromech. Microeng. vol. 15, pp. 1-9, 2005.

Hoivik, Nills D., et al. "Atomic Layer Deposited Protective Coatings for Micro-Electromechanical Systems," Sensors and Actuators A, vol. 103, pp. 100-108, 2003.

Liao, F., et al. "High-Rate Chemical Vapor Deposition of Nanocrystalline Silicon Carbide Films by Radio Frequency Thermal Plasma," Materials Letters, vol. 57, pp. 1982-1986, 2003.

Mayer, T.M., et al. "Atomic-Layer Deposition of Wear-Resistant Coatings for Microelectromechanical Devices," Applied Physics Letters, vol. 82, No. 17, pp. 2883-2885, 2003.

Mayer, T.M., et al. "LDRD Project 52523 Final Report: Atomic Layer Deposition of Highly Conformal Tribological Coatings," SAND 2005-5742, pp. 3-60, 2005.

Ehrlich, D.J., et al., "Fast Room-temperature Growth of $SiO_2$ Films by Molecular-Layer Dosing," *Appl. Phys. Lett.*, vol. 58, No. 23, (Jun. 1991) pp. 2675-2677.

Perez-Mariano, J. et al., "Multilayer Coatings by Chemical Vapor Deposition in a Fluidized Bed Reactor at Atmospheric Pressure (AP/FBR-CVD): TiN/TaN and TiN/W". Surface and Coatings Technology, vol. 201, Issue 6, (Dec. 4, 2006) pp. 2174-2180.

\* cited by examiner

DURABLE CONFORMAL WEAR-RESISTANT CARBON-DOPED METAL OXIDE-COMPRISING COATING

The present application claims priority under U.S. Provisional Application Ser. No. 60/903,151 filed Feb. 23, 2007, and titled: "Durable, Protective Anti-Stiction Functional Coating". This provisional application is incorporated by reference herein in its entirety. In addition, the present application is related to a series of patent applications pertaining to the application of thin film coatings on various substrates, particularly including the following applications, each of which is hereby incorporated by reference in its entirety: U.S. application Ser. No. 10/759,857, filed Jan. 17, 2004, and titled: Apparatus And Method For Controlled Application Of Reactive Vapors To Produce Thin Films and Coatings; U.S. application Ser. No. 11/112,664, filed Apr. 21, 2005, and titled: Controlled Deposition Of Multilayered Coatings Adhered By An Oxide Layer; U.S. application Ser. No. 10/912,656, filed Aug. 4, 2004, and titled: Vapor Deposited Functional Organic Coatings; and U.S. patent application Ser. No. 11/447,186, filed Jun. 5, 2006, and titled: Protective Thin Films For Use During Fabrication Of Semiconductors, MEMS, and Microstructures.

BACKGROUND OF THE INVENTION

1. Field of the Invention

The present invention is related to a carbon-doped alumina coating which has application as a MEMS (Micro-Electro-Mechanical Systems) surface protective, functional film.

2. Brief Description of the Background Art

This section describes background subject matter related to the invention, with the purpose of aiding one skilled in the art to better understand the disclosure of the invention. There is no intention, either express or implied, that the background art discussed in this section legally constitutes prior art.

Protective coatings currently used in the manufacture of MEMS devices include but are not limited to: moisture barrier coatings, oxidation barriers, anti-stiction coatings, "release" coatings, protective coatings for microdevices such as microfluidic devices, ink-jet heads, thin film heads, and other electronic and optical devices.

Currently known fluorocarbon coatings, such as self-assembled monolayers (SAMs) are used to provide a hydrophobic surface function; however, these coatings do not offer sufficient wear resistance. This is particularly true with respect to micromechanical or microelectromechanical devices, in which a mechanical contact (sliding, touching, or physical interaction between the parts) requires durable, protective and non-sticky (non-tacky) films.

Wear-resistant, low surface energy coatings of silicon carbide (SiC) can be deposited by a chemical vapor deposition (CVD) method, providing considerable degree of protection, specifically wear reduction. W. Ashurst et al. in an article entitled "Tribological impact of SiC encapsulation of released polycrystalline silicon microstructures", Triboloby Letters, v. 17, 2004, 195-198, describe a method for coating released polysilicon microstructures with a thin, conformal coating of SiC derived from a single source precursor. The precursor was 1,3-disilabutane (DSB). This coating method has been successfully applied to micromechanical test devices which allow the evaluation of friction and wear properties of the coating. Data for the coefficient of static friction of the SiC coatings produced from DSB is presented in FIG. 1 of this application, for reference purposes. FIG. 1 shows a graph 100 which illustrates the coefficient of friction, $\mu_s$, on axis 104, as a function of the number of wear cycles in millions on axis 102. The wear testing was done using a polysilicon sidewall friction tester of the kind described by W. R. Ashurst et al. in Tribology Lett. 17 (2004)195-198. Curve 106 represents wear testing of an oxidized polysilicon substrate with a native oxide surface. Curve 108 represents wear testing of an anti-adhesion coating produced from vapor deposited DDMS over the surface of the sidewall friction tester. Curve 110 represents wear testing of a silicon substrate which was treated with an oxygen plasma, followed by deposition of an SiC coating. The SiC coating was deposited by plasma assisted low pressure CVD, from a $SiCl_4$ precursor at about 800° C., using a technique generally known in the art. The wear was examined using scanning electron microscopy (SEM) on devices which were cycled repetitively under a nominal load. This testing shows that the application of an SiC coating having a thickness of about 40-50 nm provides good wear resistance as well as a significant reduction in friction on a micro scale.

A wear-resistant low surface energy coating which can be produced at low temperatures (in the range of about 200° C. or less) would be highly desirable. Such a coating can be produced using atomic layer deposition (ALD) films produced at relatively low temperatures in the range 177° C.; however, the coating surface energy does not appear to be low enough to provide efficient anti-stiction and passivation functions for MEMS. For example, T Mayer et al., in an article entitled: "Atomic-layer deposition of wear-resistant coatings for microelectromechanical devices", Applied Physics Letters, v. 82 N17, 28 Apr., 2003, describe a thin, conformal, wear-resistant coating applied to a micromachines Si surface structure by atomic-layer deposition (ALD). Ten nm thick films of $Al_2O_3$ were applied to a silicon surface using a binary reaction sequence with precursors of trimethyl aluminum and water. Deposition was carried out in a viscous flow reactor at 1 Torr and 168° C., with N2 as a carrier gas. Cross-section transmission electron microscopy analysis showed that the films were uniform to within 5% on MEMS device structures having an aspect ratio ranging from 0 to greater than 100. The $Al_2O_3$ film produced was stoichiometric.

Preliminary friction and wear measurements for the 10 nm thick $Al_2O_3$ films showed a friction coefficient of 0.3 for a $Si_3N_4$ ball sliding on a flat $Al_2O_3$-coated substrate, and less wear particle generation than for a native-oxide-coated silicon substrate. At the time of publication of the paper, the nature of the wear and failure process as a function of applied load had not yet been determined.

There remains a need in the industry for a low energy coating which can provide efficient anti-stiction and passivation functions for mems and which can be produced at low temperatures which are more tolerable to various MEMS substrates.

SUMMARY

A durable, functional film useful in protecting MEMS device surfaces can be produced by doping an inorganic metal oxide film with relatively high levels of carbon. Properly doped films exhibit both anti-stiction and lubricative properties. The inorganic metal oxide film is selected from the group consisting of aluminum oxide, titanium oxide, zirconium oxide, hafnium oxide, tantalum oxide, and combinations thereof. Aluminum oxide and titanium oxide work particularly well. The atomic percent of carbon dopant which is added ranges from about 5 atomic % to 20 atomic % of the film composition. Experimental results have confirmed that carbon dopant ranging from about 10 atomic % to about 15 atomic % of the film content works particularly well.

The carbon doping can be carried out using a metal oxide deposition reaction at relatively low temperatures, less than about 150° C., which produces limited oxidation. A precursor organo-metallic compound used to deposit the metal oxide via a vapor deposition technique such as atomic layer deposition, when reacted at a sufficiently low temperature, produces a metal oxide containing unoxidized (incompletely reacted) hydrocarbon, which becomes incorporated as carbon into the metal oxide film. This is contrary to traditional semiconductor manufacturing requirements, where metal oxide films are grown to be as pure as possible, to provide improved dielectric isolation performance. In one embodiment of the present invention, for example, a carbon doped aluminum oxide film can be deposited from TMA and $H_2O$ using atomic layer deposition, for example, at a temperature in the range of about 25° C. to about 120° C. Or, a titanium oxide film can be deposited from $TiCl_4$ and $H_2O$ using atomic layer deposition, at a temperature in the range of about 25° C. to about 120° C.

The incorporation of carbon into the oxide film results in a relatively durable carbonized metal oxide film which exhibits lubricative and anti-stiction properties. This has been illustrated using a microfabricated polysilicon sidewall wear tester. Such carbon doped metal films preform particularly well. For example, an alumina film doped with about 10 atomic % carbon exceeds the performance of the best data published for a silicon carbide film.

BRIEF DESCRIPTION OF THE DRAWINGS

FIG. 1 shows a graph 100 which illustrates the coefficient of friction, $\mu_s$, on axis 104, as a function of the number of wear cycles in millions on axis 102. Curve 106 represents the wear testing of a polysilicon substrate with a native oxide surface. Curve 108 represents the wear testing of an anti-adhesion coating produced from vapor deposited DDMS over the surface of a silicon substrate, and Curve 110 represents the wear testing of a silicon substrate which was treated with an oxygen plasma, followed by deposition of an SiC coating.

DETAILED DESCRIPTION OF THE PREFERRED EMBODIMENTS

Figure 1:
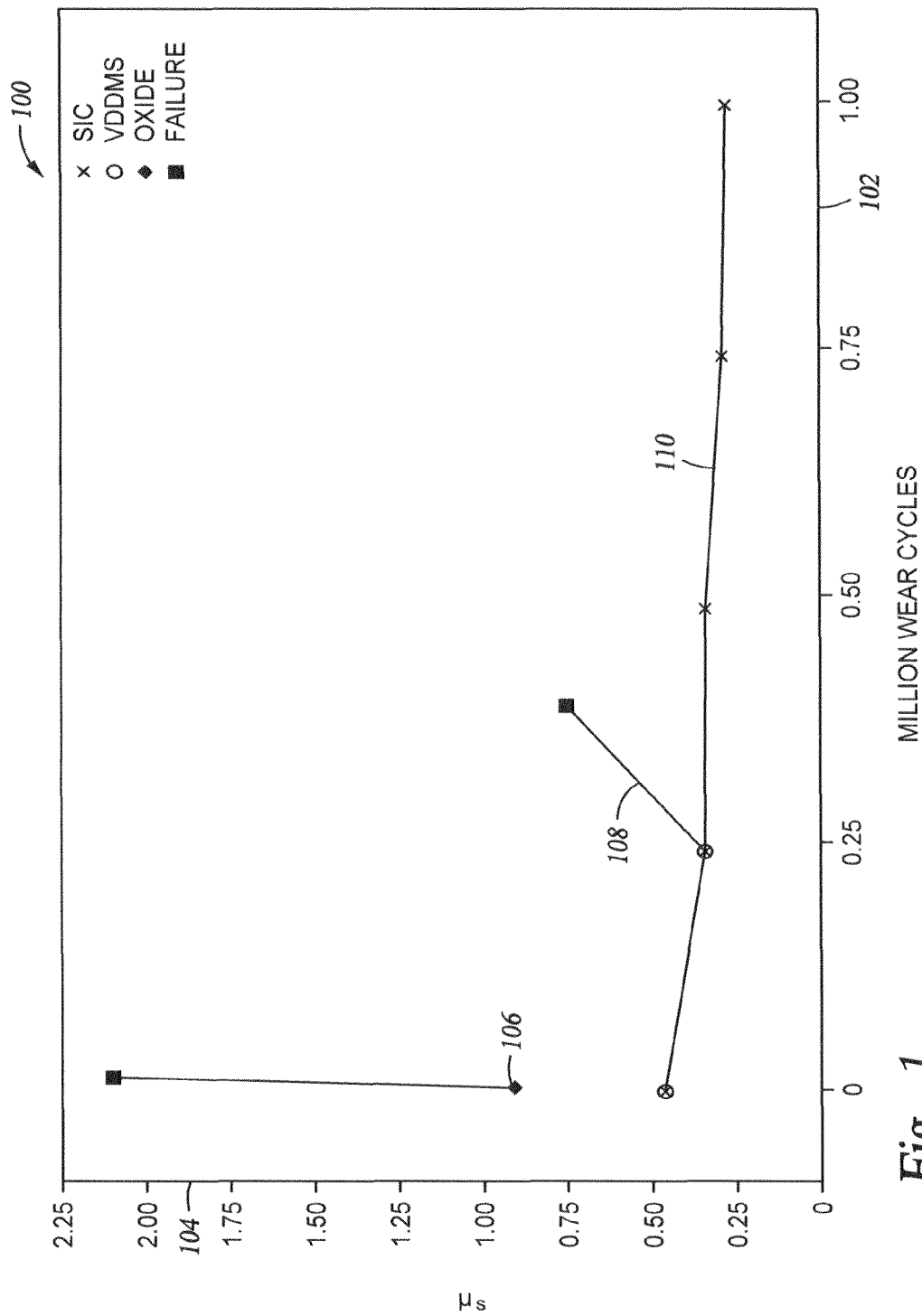
FIG. 1 shows comparative examples for prior art competitive materials.

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

One aspect of the invention relates to an atomic vapor deposition method of the kind which can be used to produce carbon-doped oxide films which are embodiments of the present invention. Another aspect of the present invention relates to various embodiment carbon-doped oxide films, of the kind which can be applied to MEMS device surfaces to provide a wear-resistant and anti-stiction performance which was not available prior to the present invention.

A durable, conformal, wear-resistant film useful in protecting MEMS device surfaces can be produced by doping an inorganic metal oxide film with relatively high levels of carbon. Properly doped films exhibit both anti-stiction and lubricative properties. The inorganic metal oxide film is selected from the group consisting of aluminum oxide, titanium oxide, zirconium oxide, hafnium oxide, tantalum oxide, and combinations thereof. Aluminum oxide, titanium oxide, and combinations thereof work particularly well. The atomic percent of carbon dopant which is added typically ranges from about 5 atomic % to 20 atomic % of the film composition. Experimental results have confirmed that a carbon dopant concentration ranging from about 10 atomic % to about 15 atomic % of the film content works particularly well.

The carbon doping can be carried out using a metal oxide deposition reaction at relatively low temperatures, which produces limited oxidation. A precursor organo-metallic compound used to deposit the metal oxide via a vapor deposition technique such as atomic layer deposition, when reacted at a sufficiently low temperature, produces a metal oxide containing unoxidized (incompletely reacted) hydrocarbon, which becomes incorporated as carbon into the metal oxide film. This is contrary to traditional semiconductor manufacturing requirements, where metal oxide films are grown to be as pure as possible, to provide improved dielectric isolation performance.

EXAMPLES OF ATOMIC LAYER DEPOSITION OF CARBON-DOPED METAL OXIDE FILMS FROM ORGANO-METALLIC PRECURSORS

Example One

Pure alumina films can be deposited using various vacuum deposition methods. Examples include physical vapor deposition (PVD), which is typically sputtered deposition, but may be deposition from evaporated material, and atomic layer deposition (ALD), not by way of limitation.

In an ALD process, thin layers of metal oxides may be deposited using a variety of organometallic precursors which are commonly known in the art. After reading the present disclosure, one of skill in the art may produce carbon-doped metal oxide films using an ALD process where the precursor for film formation is organometallic alone, organometallic with water, and organometallic with ozone, by way of example and not by way of limitation. For purposes of illustrating an embodiment of the invention which is likely to be used frequently, employment of an organometallic precursor in combination with water is described. Carbon-doped metal oxide films can be tailored easily when deposited using two or more different vapor phase reactants. In the case of a two reactant process, the substrate surface is contacted with a dose of vapor from a first precursor, followed by pumping away of any excess unreacted vapor. Subsequently, the substrate surface is contacted with a dose of vapor from the second precursor, which is allowed to react with the first precursor which is present on the substrate surface, then any excess unreacted vapor is pumped away. This process may be repeated a number of times, with each repetition being considered to be one "cycle". The number of cycles determines the total thickness of the deposited film/layer. In each step of a cycle, it is important that the amount of material deposited on the substrate surface is uniform, and that at least a minimum coverage of the surface, i.e. a saturation of the surface is achieved. To deposit a metal oxide by ALD, the first precursor is typically an organo-metallic material, and the second precursor is typically water.

In an embodiment of the present invention, the commonly used ALD process has been changed in order to incorporate carbon from the organo-metallic precursor into the deposited film. To produce a carbon-doped aluminum oxide film, where the carbon atomic content of the film was 10%, the following process was used.

The processing chamber used to produce the carbon-doped aluminum oxide film was an MVD Model 100, available from Applied Microstructures, Inc. of San Jose, Calif. The temperature of the processing chamber and the sample was 65° C. The processing chamber was purged with nitrogen gas initially and between sequential exposures to precursor "A" which was trimethylaluminum (TMA) and precursor "B" which was water vapor. Ten nitrogen purge cycles were carried out after exposure of the substrate to TMA, and after exposure of the substrate to water vapor. Nitrogen gas pressure during a purge was in the range of about 10 Torr. In addition, the chamber pressure was pumped down to a base pressure of 0.1 Torr after the nitrogen purge and prior to the charging of water vapor.

While the nominal values provided above are with respect to this Example One, one skilled in the art may use a nitrogen gas pressure during the purge which is in the range of about 1 Torr to about 100 Torr, typically about 10 Torr to about 20 Torr. In addition, the pump down of the chamber between charging of a first precursor and the charging of a second precursor may employ a base pressure ranging from about 0.001 Torr and about 1 Torr, typically from about 0.01 Torr and about 0.1 Torr.

The pressure in the processing chamber during the charge of each TMA injection was 0.2 Torr, and the pressure in the processing chamber during each water vapor injection was 0.8 Torr. The substrate temperature was at 65° C. during a TMA reaction period, and the time period of substrate exposure to the TMS was 15 seconds, prior to purge with nitrogen gas, followed by a subsequent pump down to base pressure. The substrate temperature was at 65° C. during a water vapor reaction period, and the time period of substrate exposure to the water vapor was 15 seconds prior to purge with nitrogen gas, followed by a subsequent pump down to base pressure. Approximately 1.5 Å of carbon-doped film was deposited during each single deposition cycle. Fifty deposition cycles were carried out to form a film having a thickness of 77 Å.

While the nominal values provided above are with respect to this Example One, one skilled in the art may use a TMA injection pressure in the processing chamber ranging from about 0.01 Torr to about 1.0 Torr, typically ranging from about 0.1 Torr to about 0.5 Torr. Pressure during the water vapor injection may range from about 0.01 Torr to about 5 Torr, typically ranging from about 0.1 Torr to about 1 Torr. The substrate temperature during formation of the film may range from about 35° C. to about 120° C., and is typically in the range of from about 50° C. to about 80° C.

The number of deposition cycles is typically in the range from about 10 to about 100, depending on the required film thickness, with each cycle producing from about 1.2 Å to about 2.0 Å of film thickness. As a result, the protective film/layer thickness is in the range of about 20 Å to about 400 Å, and is typically in the range of about 20 Å to about 100 Å. One of skill in the art will recognize that the deposition rate of the carbon-doped film of the present invention is typically higher than the deposition rate of the previously produced pure aluminum oxide film.

An optional SAM fluorocarbon film may be deposited on top of the doped alumina film using methods generally available, to provide an additional hydrophobic surface property or other functional property. This may be used to prevent stiction during manufacturing, for example, with the knowledge that the SAM will not hold up well under frictional wear in-use conditions. Multi-layered, laminated oxide film may be formed where a portion of the oxide layers are carbon-doped layers.

Figure 2:
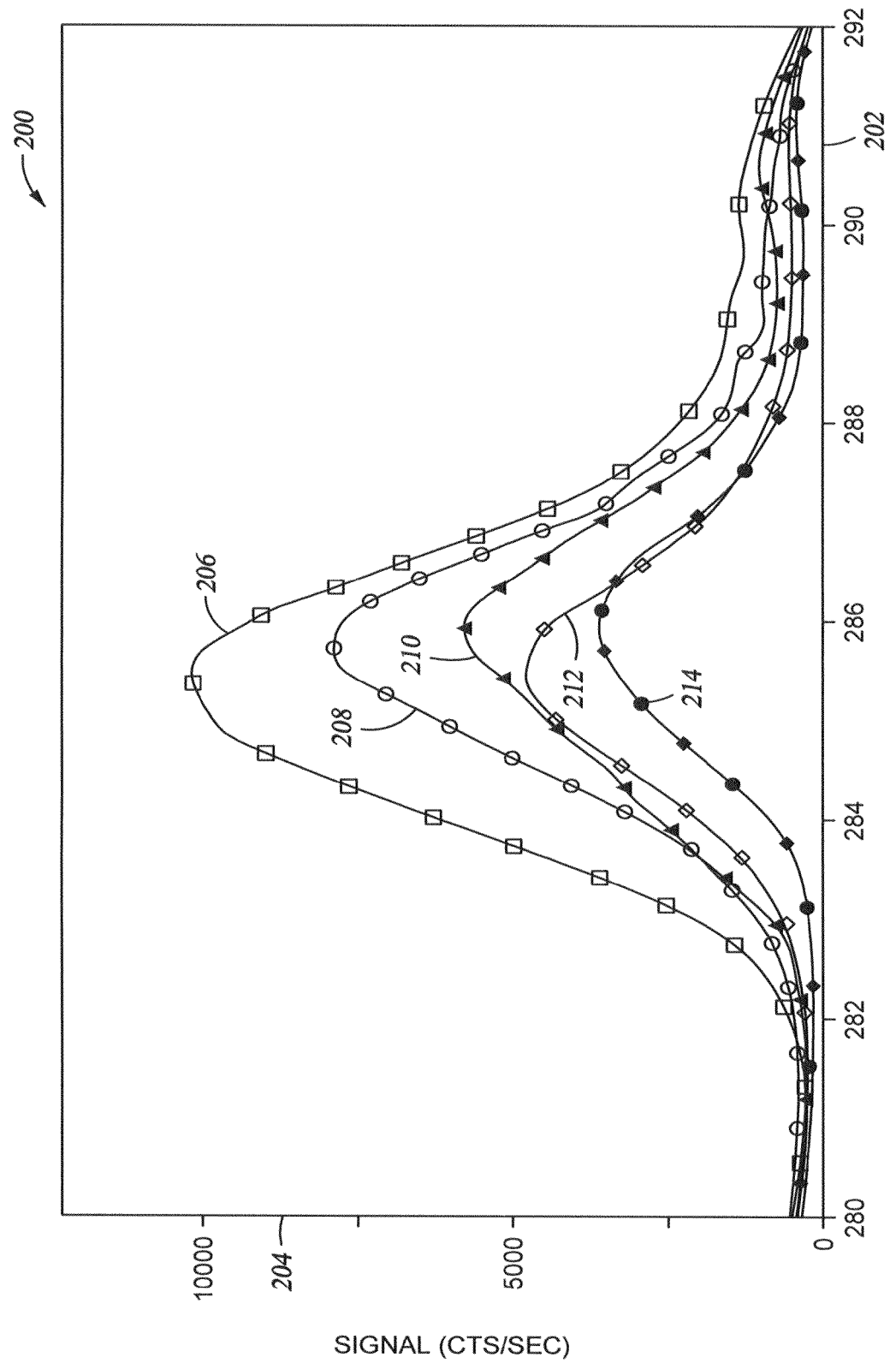
FIG. 2 shows a graph 200 illustrating the XPS spectra taken of a carbon-doped alumina layer deposited using molecular vapor deposition (MVD) at low temperature. The signal strength at the binding energy indicative of carbon clearly illustrates the presence of carbon in the aluminum oxide film.

FIG. 2 shows a graph 200 illustrating the XPS spectra taken of a carbon-doped alumina layer deposited using molecular vapor deposition (MVD) at low temperatures. The Binding Energy in EV is shown on the axis 202, and indicates the presence of carbon. The signal strength for the presence of carbon in cts/sec is shown on axis 204. Curve 206 represents a carbon-doped aluminum oxide film which was deposited at a substrate temperature of 65° C. Curve 208 represents a carbon-doped aluminum oxide film which was deposited at a substrate temperature of 55° C. Curve 210 represents a carbon-doped aluminum oxide film which was deposited at a substrate temperature of 33° C. Curve 212 represents a carbon-doped aluminum oxide film which was deposited at a substrate temperature of 80° C. Curve 214 represents a carbon-doped aluminum oxide film which was deposited at a substrate temperature of 120° C. This graph indicates that there may be an optimum substrate temperature for increasing the carbon content in the deposited carbon-doped aluminum oxide film. That optimum temperature is lower than 120° C. and higher than 33° C., with 65° C. providing a higher carbon content than 55° C.

Example Two

Figure 3:
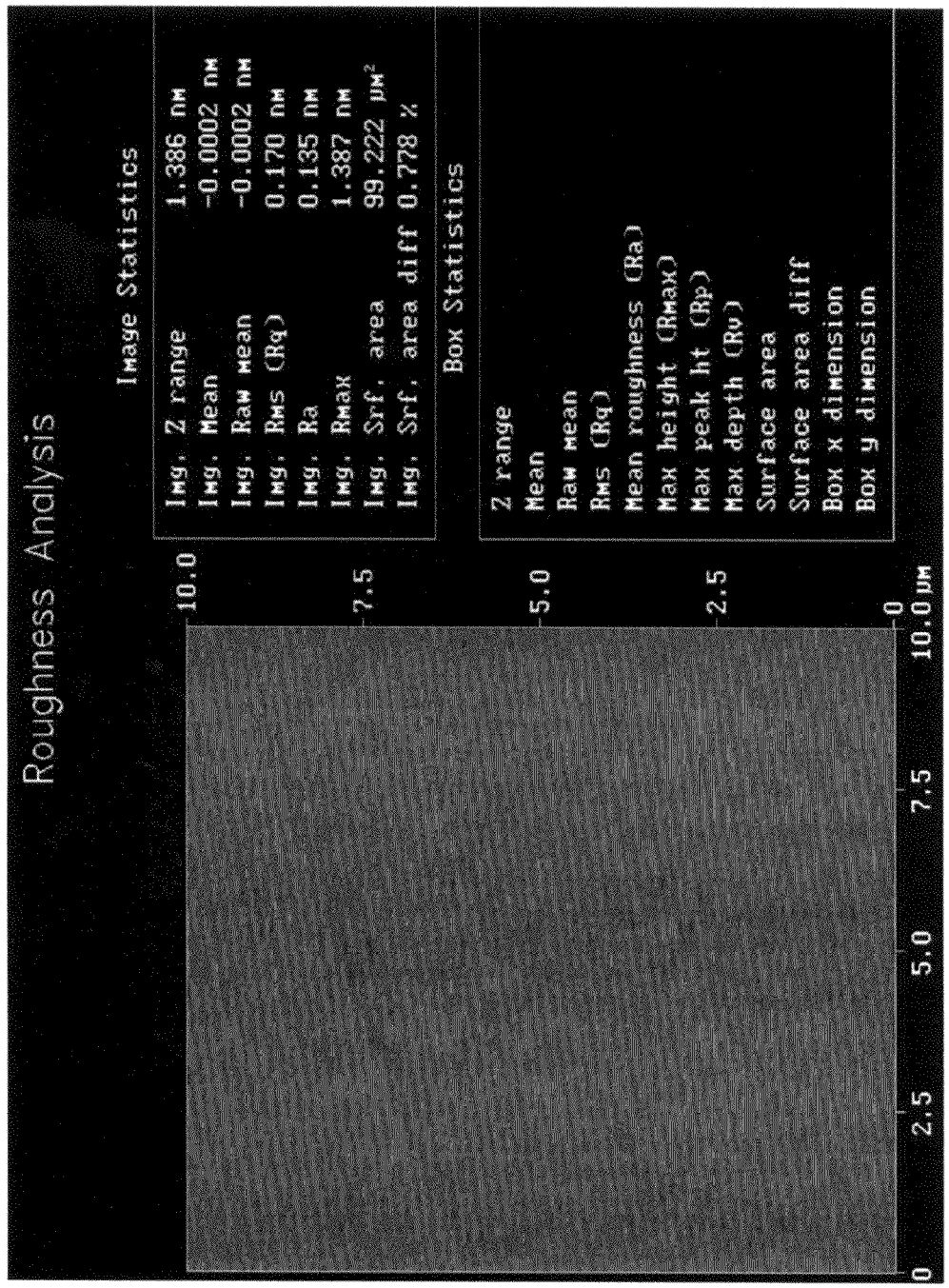
FIG. 3 shows the roughness of a carbon-doped alumina film, as illustrated by an atomic force microscope scan. The surface morphology is very smooth with an RMS of 0.170 nm.

FIG. 3 shows the roughness of a carbon-doped alumina film, as illustrated by an atomic force microscope scan. This film was formed by the method described in Example One. The surface image represents a 10.0 μm by 10.0 μm size. The RMS is 0.17 nm, which is similar to a virgin silicon wafer surface RMS, indicating that the coating is extremely conformal with the surface upon which it is deposited.

Figure 4A:
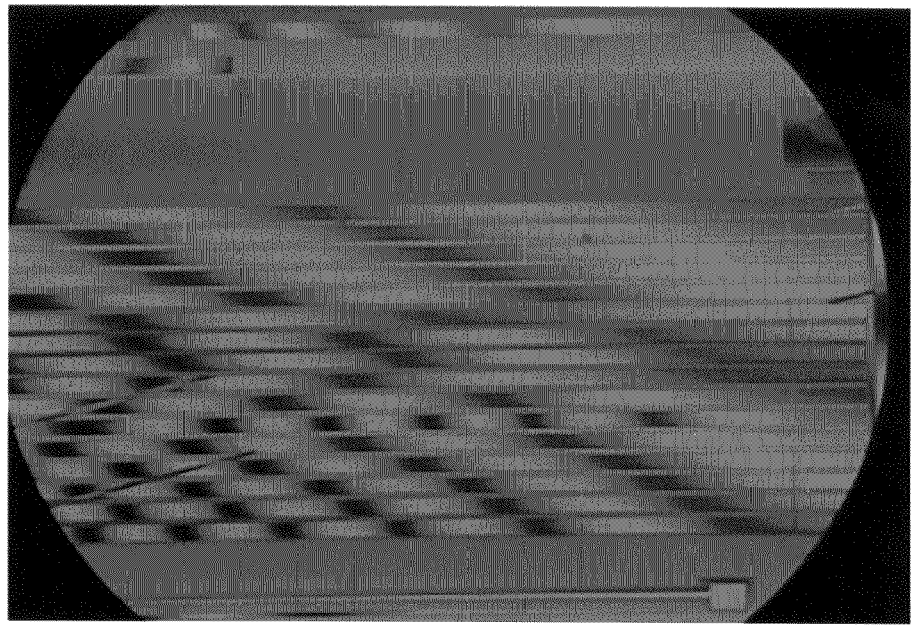
FIGS. 4A and 4B show cantilever beam arrays coated with low temperature carbon-doped aluminum oxide. The polysilicon detachment length is greater than 1500 μm, which corresponds with a work of adhesion of less than 1 μJ/m².
Figure 4B:
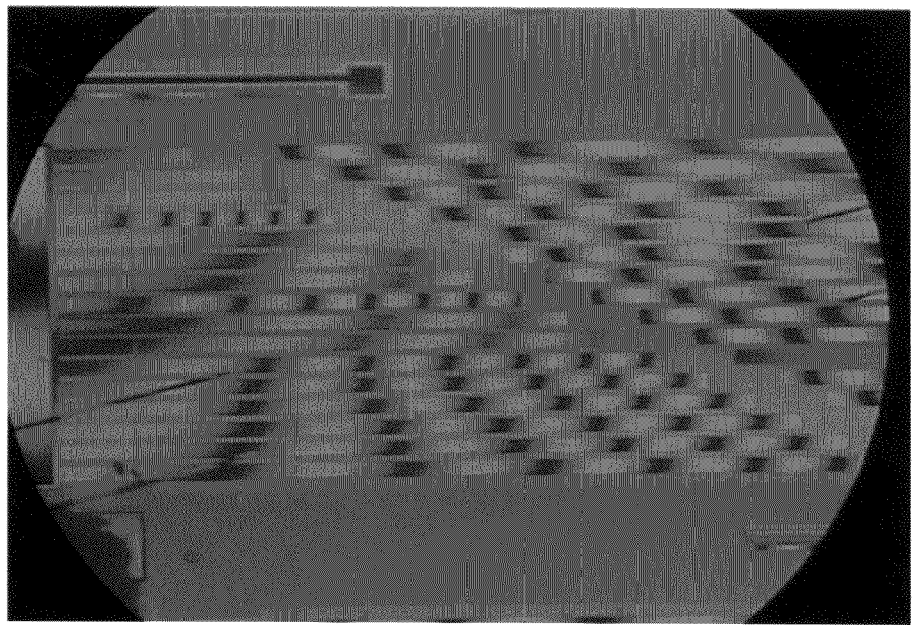

FIGS. 4A and 4B show cantilever beam arrays coated with low temperature carbon-doped aluminum oxide film. The polysilicon detachment length was greater than 1500°m, which corresponds to a work of adhesion which is less than 1 μJ/m$^2$. This compares with a work of adhesion in the range of about 20,000 μJ/m$^2$ for an oxidized silicon surface. The polysilicon detachment length (which is an indication of stiction properties for a polysilicon cantilever beam), for a 2.5 μm thick, 2 μm gap polysilicon cantilever, coated with the carbon-doped aluminum oxide film of Example One, is greater than 1,500 μm. This compares with a pure aluminum oxide coated polysilicon cantilever of the same thickness and gap size, which exhibits a detachment length of 0 μm. Finally, the coefficient of friction measured for the carbon-doped aluminum oxide film deposited over a silicon substrate (as described with reference to Example One) was 0.1. This compares with an oxidized polysilicon surface which exhibits a coefficient of friction in the range of 1.1. Experimentation has indicated that the coefficient of friction for carbon-doped aluminum oxide films deposited in the manner described in example One, where the carbon atomic % in the film ranges from about 5% to about 20% ranges from about 0.05 to about 0.4.

Example Three

Figure 5A:
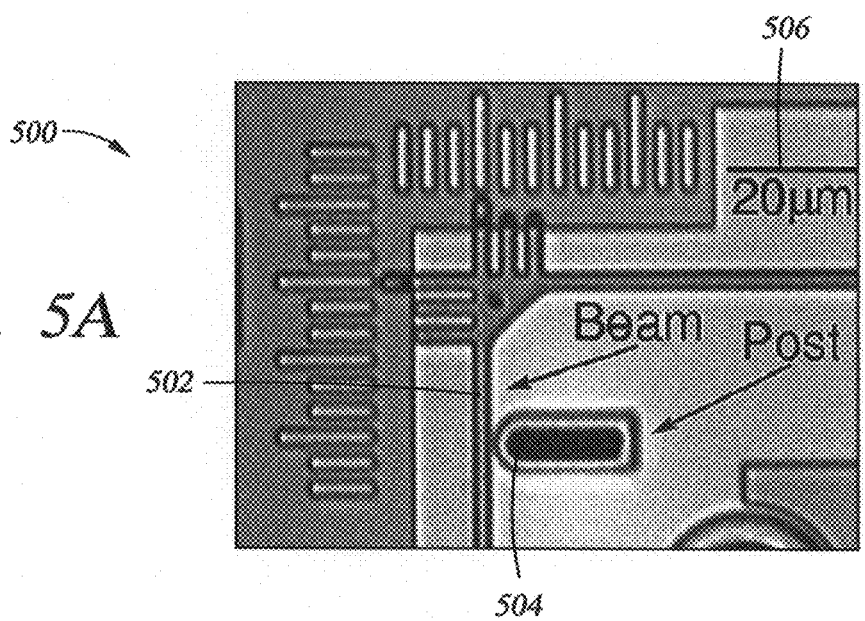
FIG. 5A shows an SEM image of a polysilicon wear testing structure 500, including beam 502 and post 504, which can be used to test sidewall friction along a beam surface, for example. The scale 506 shows 20 μm, illustrating the size of the elements shown.

FIG. 5A shows an SEM image of a polysilicon wear testing structure 500, including beam 502 and post 504, which can be used to test sidewall friction along a beam surface, for example. The scale 506 shows 20 μm, illustrating the size of the elements shown.

Figure 5B:
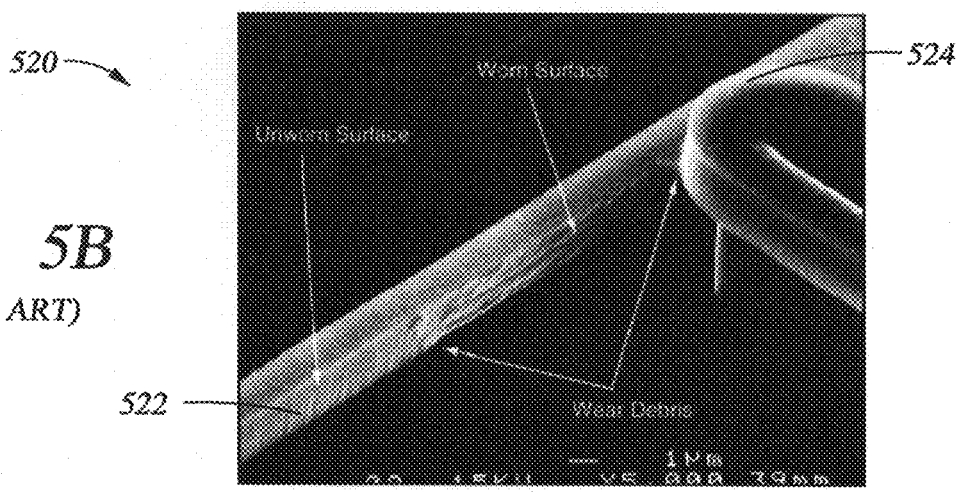
FIG. 5B shows a comparative view 520 of contacting parts which were coated with vapor deposited DDMS, a beam 522 and a post 524, where the contacting parts were subjected to 250,000 wear cycles. Substantial wear (scarring) is shown on the beam, and wear debris is shown at the edge of the rubbed part of the beam 522 and on the anchored post 524.

FIG. 5B shows a comparative view 520 of contacting parts which were coated with vapor deposited DDMS, a beam 522 and a post 524, where the contacting parts were subjected to 250,000 wear cycles. Substantial wear (scarring) is shown on the beam, and wear debris is shown at the edge of the rubbed part of the beam 522 and on the anchored post 524.

Figure 5C:
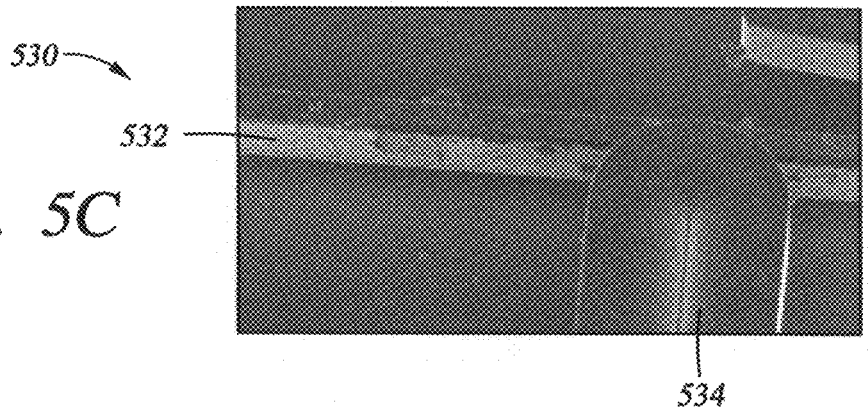
FIG. 5C shows an SEM photomicrograph 530 of the contacting parts of a polysilicon substrate coated with a carbon-doped aluminum oxide film, after the contacting beam 532 and post 534 were subjected to 1,000,000 wear cycles.

FIG. 5C shows an SEM photomicrograph 530 of the contacting parts of a polysilicon substrate coated with a carbon-doped aluminum oxide film, after the contacting beam 532 and post 534 were subjected to 1,000,000 wear cycles. While there is some debris on the surface of contacting beam 532, which may be carbon-related debris, there is no major scarring of the surface of contacting beam 532.

While the foregoing is directed to embodiments of the present invention, other and further embodiments of the invention may be devised in view of the present disclosure, without departing from the basic scope of the invention, and the scope thereof is determined by the claims which follow.

We claim:

1. A device having a wear-resistant protective film which provides a coefficient of friction which is less than about 0.4, wherein said device comprises:
   a MEMS device; and
   a carbon-doped metal oxide film applied over a surface of said MEMS device, wherein said metal is selected from the group consisting of aluminum, indium, titanium, zirconium, hafnium, tantalum, and combinations thereof, wherein a carbon content of said carbon-doped film ranges from about 5 atomic % to about 20 atomic %, wherein the carbon-doping provides for a measured work of adhesion less than or equal to 10 μJ/m².

2. A device having a wear-resistant protective film in accordance with claim 1, wherein said coefficient of friction ranges from about 0.05 to about 0.4.

3. A device having a wear-resistant protective film in accordance with claim 1, wherein said metal is selected from the group consisting of aluminum, titanium, and combinations thereof.

4. A device having a wear-resistant protective film in accordance with claim 1, wherein said carbon content of said carbon-doped film ranges from about 10 atomic % to about 20 atomic %.

5. A device having a wear-resistant protective film in accordance with claim 2, or claim 3, or claim 4, wherein said film thickness ranges from about 20 Å to about 400 Å.

6. A device having a wear-resistant protective film in accordance with claim 1, wherein said measured work of adhesion ranges from 10 μJ/m² to about 0.5 μJ/m².

7. A device having a wear-resistant protective film in accordance with claim 1, wherein said MEMS device is selected from the following: bio-MEMS device, microfluidic device, ink-jet head, thin film head, or optical device.

8. A device having a wear-resistant protective film, comprising:
   a MEMS device; and
   a carbon-doped aluminum oxide film applied over a surface of said MEMS device, wherein a carbon content of said carbon-doped aluminum oxide film ranges from about 10 atomic % to about 15 atomic %;
   wherein said film has a coefficient of friction which is less than about 0.4; and
   wherein the carbon-doping provides for a measured work of adhesion less than or equal to 10 μJ/m².

9. A device having a wear-resistant protective film in accordance with claim 8, wherein a thickness of said film ranges from about 20 Å to about 100 Å.

10. A device having a wear-resistant protective film in accordance with claim 8, wherein the carbon-doping provides for a measured work of adhesion for said MEMS device of less than 1 μJ/m².

11. A device having a wear-resistant protective film, comprising:
   a MEMS device; and
   a carbon-doped titanium oxide film applied over a surface of said MEMS device, wherein a carbon content of said carbon-doped titanium oxide film ranges from about 10 atomic % to about 15 atomic %;
   wherein said film has a coefficient of friction which is less than about 0.4;
   wherein the carbon-doping provides for a measured work of adhesion less than or equal to 10 μJ/m².

12. A device having a wear-resistant protective film in accordance with claim 11, wherein a thickness of said film ranges from about 20 Å to about 100 Å.

13. A device having a wear-resistant protective film in accordance with claim 11, wherein the carbon-doping provides for a measured work of adhesion for said MEMS device of less than 1 μJ/m².

14. A device having a wear-resistant protective film which provides a coefficient of friction which is less than about 0.4, wherein said device comprises:
   a device selected from the following: biochip device, microfluidics device, or microarray device; and
   a carbon-doped metal oxide film applied over a surface of said device, wherein said metal is selected from the group consisting of aluminum, indium, titanium, zirconium, hafnium, tantalum, and combinations thereof, wherein a carbon content of said carbon-doped film ranges from about 5 atomic % to about 20 atomic %, wherein the carbon-doping provides for a measured work of adhesion less than or equal to 10 μJ/m².

15. A device having a wear-resistant protective film in accordance with claim 14, wherein said metal is aluminum.

16. A device having a wear-resistant protective film in accordance with claim 14, wherein said metal is titanium.

* * * * *